US012805387B2

(12) United States Patent
Zhang

(10) Patent No.: US 12,805,387 B2
(45) Date of Patent: Nov. 17, 2026

(54) DOUBLE-SURFACE DISPLAY PANEL AND DOUBLE-SURFACE SPLICED DISPLAY SCREEN

(71) Applicant: TCL CHINA STAR OPTOELECTRONICS TECHNOLOGY CO., LTD., Shenzhen (CN)

(72) Inventor: Yinfeng Zhang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 1359 days.

(21) Appl. No.: 17/623,547

(22) PCT Filed: Dec. 22, 2021

(86) PCT No.: PCT/CN2021/140365

§ 371 (c)(1),
(2) Date: Jun. 22, 2023

(87) PCT Pub. No.: WO2023/108745

PCT Pub. Date: Jun. 22, 2023

(65) Prior Publication Data

US 2024/0047434 A1 Feb. 8, 2024

(30) Foreign Application Priority Data

Dec. 13, 2021 (CN) ......................... 202111514385.X

(51) Int. Cl.
*H10W 90/00* (2026.01)
*H10H 20/85* (2025.01)

(52) U.S. Cl.
CPC ........ *H10W 90/00* (2026.01); *H10H 20/8506* (2025.01)

(58) Field of Classification Search
CPC ... H10H 20/00–882; H10H 29/00–142; H10H 29/30–962; H10H 20/8506;
(Continued)

(56) References Cited

U.S. PATENT DOCUMENTS

2010/0053505 A1 3/2010 Yamazaki et al.
2013/0021768 A1* 1/2013 Kim .................... H01L 23/3736 361/783
(Continued)

FOREIGN PATENT DOCUMENTS

CN 107680989 A 2/2018
CN 109285858 A 1/2019
(Continued)

OTHER PUBLICATIONS

International Search Report in International application No. PCT/CN2021/140365, mailed on Sep. 20, 2022.
(Continued)

*Primary Examiner* — Ismail A Muse
(74) *Attorney, Agent, or Firm* — PV IP PC; Christopher S. Ruprecht; Wei Te Chung

(57) ABSTRACT

A double-surface display panel and a double-surface spliced display screen are disclosed. The double-surface display panel comprises a substrate, a plurality of first micro light-emitting diode (LED) units, and a plurality of second LED unis. The first micro LED units and the second LED units are disposed on a same side or different sides of the substrate. A light-emitting direction of the second micro LED units and a light-emitting direction of the first micro LED units are opposite. The first micro LED units and the second micro LED units, which have different light-emitting directions, share the same substrate. Therefore, a thickness of an entire film of the double-surface display panel can be reduced.

14 Claims, 7 Drawing Sheets

(58) Field of Classification Search
CPC . H10H 20/857; H01L 25/0753; H01L 25/167; G09F 9/302; G09F 9/33
See application file for complete search history.

(56) References Cited

U.S. PATENT DOCUMENTS

| | | | | |
|---|---|---|---|---|
| 2014/0197388 | A1 | 7/2014 | Zhang | |
| 2016/0329381 | A1* | 11/2016 | Xu | G02F 1/157 |
| 2017/0117342 | A1 | 4/2017 | Kwon | |
| 2019/0064580 | A1* | 2/2019 | Li | G02F 1/134309 |
| 2019/0101788 | A1* | 4/2019 | Zhao | G02F 1/133512 |
| 2019/0103060 | A1 | 4/2019 | Kang | |
| 2019/0317275 | A1* | 10/2019 | Wu | G09F 9/3026 |
| 2019/0317343 | A1* | 10/2019 | Li | G09G 3/36 |
| 2020/0142247 | A1* | 5/2020 | Zhao | G02F 1/133504 |
| 2020/0209658 | A1* | 7/2020 | Xiao | G02F 1/133514 |
| 2020/0211455 | A1 | 7/2020 | Yang | |
| 2021/0327340 | A1* | 10/2021 | Fan | G09G 3/32 |
| 2021/0335961 | A1* | 10/2021 | Hou | H10K 19/901 |
| 2021/0367022 | A1 | 11/2021 | Tang | |
| 2022/0163857 | A1* | 5/2022 | Watanabe | H10D 86/60 |
| 2022/0165785 | A1* | 5/2022 | Liao | H10H 29/142 |
| 2024/0047628 | A1* | 2/2024 | Hu | H10H 20/852 |
| 2024/0329466 | A1* | 10/2024 | Peng | G02F 1/136209 |

FOREIGN PATENT DOCUMENTS

| | | | |
|---|---|---|---|
| CN | 109461744 | A | 3/2019 |
| CN | 110112183 | A | 8/2019 |
| CN | 110164322 | A | 8/2019 |
| CN | 110224008 | A | 9/2019 |
| CN | 110265437 | A | 9/2019 |
| CN | 110824696 | A | 2/2020 |
| CN | 110828528 | A | 2/2020 |
| CN | 111063711 | A | 4/2020 |
| CN | 111192912 | A | 5/2020 |
| CN | 111584578 | A | 8/2020 |
| CN | 112786668 | A | 5/2021 |
| CN | 113031280 | A | 6/2021 |
| CN | 113299703 | A | 8/2021 |
| CN | 113555379 | * | 10/2021 |
| CN | 113555379 | A | 10/2021 |
| JP | 2004152612 | A | 5/2004 |
| JP | 2011059339 | A | 3/2011 |
| WO | 2021232739 | A1 | 11/2021 |

OTHER PUBLICATIONS

Written Opinion of the International Search Authority in International application No. PCT/CN2021/140365, mailed on Sep. 20, 2022.

Chinese Office Action issued in corresponding Chinese Patent Application No. 202111514385.X dated Jul. 4, 2022, pp. 1-9.

* cited by examiner

DOUBLE-SURFACE DISPLAY PANEL AND DOUBLE-SURFACE SPLICED DISPLAY SCREEN

FIELD

The present disclosure relates to a field of display technologies, and more particularly, to a double-surface display panel and a double-surface spliced display screen.

BACKGROUND

With rapid development of display technologies, applications of display technologies, such as liquid crystal displays (LCDs) and organic light-emitting diodes (OLEDs), have become more and more diverse, e.g., transparent displays and reflective displays. As an application which can effectively save space in display screens being occupied, double-surface displays have been used in many fields. Rapid development of the LCDs further boosts development of the double-surface displays. However, the LCDs require a backlight module, which directly increases a module thickness of the double-surface displays. Micro light-emitting diode (micro LED) displays and OLED displays have an advantage of self-luminescence. However, in the micro LED displays, a printed circuit board (PCB) is used as a substrate and is driven by an integrated chip power management, LED chips and IC chips are distributed on two sides of the PCB. Components, such as input control units, are also provided. Therefore, a thickness of a single PCB substrate of micro LED display modules is even greater than a thickness of LCD modules. As to the OLED displays, they realize a double-surface display function by two glass correspondingly assembled to each other. Compared with LCD modules and micro LED display modules, OLED display modules have a significantly reduced thickness. However, the thickness is still too great and processes for manufacturing the OLED display modules are difficult. Furthermore, requirements for flatness of glass after the manufacturing processes are extremely high.

Therefore, how to realize double-surface displays with a low thickness of modules and a great flatness is vital in industry.

SUMMARY

Embodiments of the present disclosure provide a double-surface display panel and a double-surface spliced display screen to solve a following issue: conventional double-surface display panels have a relatively great thickness and a poor flatness.

To solve the above issue, technical solutions provided by the present disclosure are described as follows:

An embodiment of the present disclosure provides a double-surface display panel, comprising:

a substrate, wherein the substrate comprises a first side and a second side opposite to each other;

a plurality of first micro light-emitting diode (micro LED) units distributed in an array manner, wherein the first micro LED units are disposed on the first side or the second side; and a plurality of second micro light-emitting diode (micro LED) units distributed in an array manner, wherein the second micro LED units are disposed on the first side or the second side, and a light-emitting direction of the second micro LED units is opposite to a light-emitting direction of the first micro LED units.

In some embodiments of the present disclosure, the double-surface display panel comprises a pixel driving circuit layer, wherein the pixel driving circuit layer is disposed between the first micro LED units and the substrate, and/or the pixel driving circuit layer is disposed between the second micro LED units and the substrate.

In some embodiments of the present disclosure, the first micro LED units and the second micro LED units are disposed on a same side of the substrate, the first micro LED units and the second micro LED units are disposed on a same layer of the pixel driving circuit layer, and an orthographic projection of the first micro LED units on the substrate and an orthographic projection of the second micro LED units on the substrate do not overlap each other.

In some embodiments of the present disclosure, the double-surface display panel comprises:

a first black matrix, wherein the first black matrix is disposed on a light-emitting side of the first micro LED units, and an orthographic projection of the first black matrix on the substrate covers the orthographic projection of the second micro LED units on the substrate; and a second black matrix, wherein the second black matrix is disposed on a light-emitting side of the second micro LED units, and an orthographic projection of the second black matrix on the substrate covers the orthographic projection of the first micro LED units on the substrate.

In some embodiments of the present disclosure, the first micro LED units are disposed on the first side, and the second micro LED units are disposed on the second side, the pixel driving circuit layer comprises a first pixel driving circuit disposed between the first micro LED units and the substrate, and a second pixel driving circuit disposed between the second micro LED units and the substrate.

In some embodiments of the present disclosure, the double-surface display panel comprises a light-shielding layer, and the light-shielding layer is disposed between the first micro LED units and the second micro LED units.

In some embodiments of the present disclosure, an orthographic projection of the light-shielding layer on the substrate covers the orthographic projection of the first micro LED units on the substrate and the orthographic projection of the second micro LED units on the substrate.

In some embodiments of the present disclosure, at least one end portion of the double-surface display panel is connected to at least one chip on flex (COF) substrate, and a driver chip is bonding connected to the COF substrate.

In some embodiments of the present disclosure, the COF substrate extends along a direction parallel to the double-surface display panel, an end of the COF substrate is bonding connected to the double-surface display panel, and another end of the COF substrate is bonding connected to a control circuit board.

In some embodiments of the present disclosure, the driver chip is a source driver chip or a gate driver chip.

An embodiment of the present disclosure further provides a double-surface spliced display screen, comprising multiple double-surface display panels of the above embodiments spliced to each other.

Regarding the beneficial effects: embodiments of the present disclosure provide a double-surface display panel and a double-surface spliced display screen. A plurality of first micro LED units and a plurality of second micro LED units, which have opposite light-emitting directions, are disposed on a same substrate. Therefore, a thickness of an entire film of the double-surface display panel can be reduced and can be less than 1 mm, thereby realizing extremely thin double-surface displays.

DETAILED DESCRIPTION

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

Figure 1:
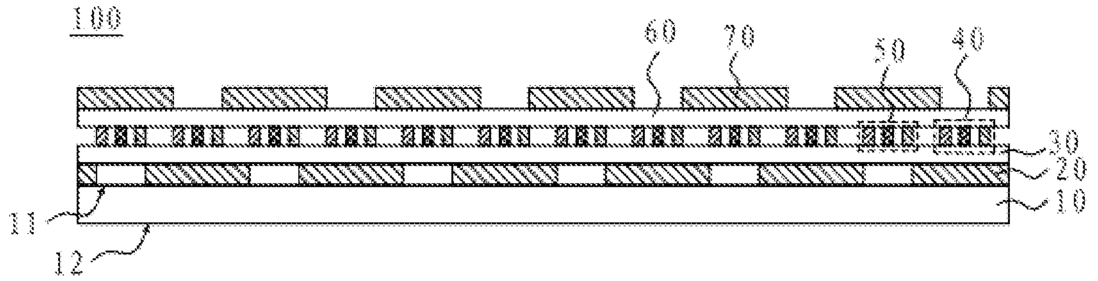
FIG. 1 is a structural schematic view showing a double-surface display panel provided by an embodiment of the present disclosure.
Figure 2:
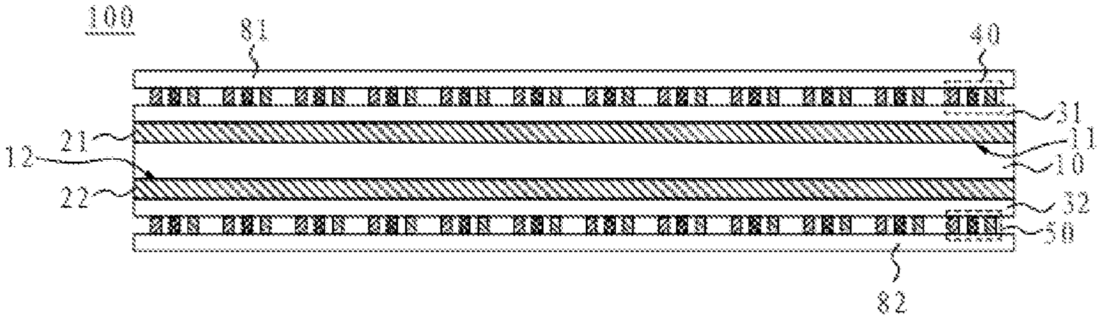
FIG. 2 is a structural schematic view showing a double-surface display panel provided another embodiment of the present disclosure.

Please refer to FIG. 1 or FIG. 2, an embodiment of the present disclosure provides a double-surface display panel 100. The double-surface display panel 100 includes a substrate 10 and a plurality of first micro light-emitting diode (micro LED) units 40 arranged in an array manner. The substrate 10 includes a first side 11 and a second side 12 opposite to each other. The first micro LED units 40 may be disposed on the first side 11 of the substrate 10 or the second side 12 of the substrate 10. The second micro LED units 50 may be disposed on the first side 11 of the substrate 10 or the second side 12 of the substrate That is, the first micro LED units 40 and the second micro LED units 50 can be disposed on a same side of the substrate 10, or can also be disposed on different sides of the substrate 10. A light-emitting direction of the first micro LED units 40 is opposite to a light-emitting direction of the second micro LED For example, the first micro LED units 40 can emit light upward to display an image on a front side, the second micro LED units 50 can emit light downward to display an image on a backside. Compared with conventional micro LED double-surface display panels, in the present embodiment, the first micro LED units 40 and the second micro-LED units 50 share the same substrate 10 to realize a double-surface display function. Therefore, a thickness of an entire film of the double-surface display panel 100 can be reduced and can be less than 1 mm. As such, extremely thin double-surface displays are realized.

In the embodiment of the present disclosure, the substrate 10 may be a glass substrate. In other embodiments, the substrate 10 may also be a substrate made of other transparent materials.

The first micro LED units 40 and the second micro LED units 50 include at least one micro LED chip. Each micro LED chip is configured to form a sub-pixel. In one specific embodiment, the first micro LED units 40 and the second micro LED units 50 each includes a red micro LED chip, a green micro LED chip, and a blue micro LED chip, thereby realizing displaying three primary colors of red, green, and blue.

As shown in FIG. 1 or FIG. 2, the double-surface display panel 100 further includes a pixel driving circuit layer 30 disposed between the first micro LED units 40 and the substrate 10, and/or between the second micro LED units 50 and the substrate 10. The pixel driving circuit layer 30 includes a plurality of pixel driving circuits distributed in an array manner. Any one of the pixel driving circuits drives at least one of the first micro LED units 40 or at least one of the second micro LED units 50 to emit light. The pixel driving circuit includes a plurality of thin-film transistors (TFTs) electrically connected to each other.

As shown in FIG. 1, in some embodiments of the present disclosure, the first micro LED units 40 and the second Micro LED units 50 may be disposed on a same side of the substrate 10. In the present disclosure, the first micro LED units 40 and the second micro LED units 50 are disposed on the first side 11. In other embodiments, the first micro LED units 40 and the second micro LED units 50 may both be disposed on the second side 12.

To facilitate an electrical connection between the pixel driving circuit layer 30, the first micro LED units 40, and the second micro LED units 50, the pixel driving circuit layer 30, the first micro LED units 40, and the second micro LED units 50 may also be disposed on a same side.

The first micro LED units 40 and the second micro LED units 50 are disposed on a same layer of the pixel driving circuit layer 30. By disposing the first micro LED units 40 and the second micro LED units 50 on the same layer, one bonding process can be saved. In specific manufacturing processes, micro LED chips can be bonded to the substrate 10 having the pixel driving circuit layer 30 by a mass transfer process.

The double-surface display panel further includes an encapsulation layer 60 covering the first micro LED units 40 and the second micro LED units After the micro LED chips are bonded to the substrate 10, the encapsulation layer 60 is formed on the first micro LED units 40 and the second micro LED unit 50, thereby realizing a protective effect.

An orthographic projection of the first micro LED units 40 on the substrate 10 and an orthographic projection of the second micro LED units 50 on the substrate 10 do not overlap each other. That is, the first micro LED units and the second micro LED units 50 need to be spacedly distributed, thereby preventing optical interference between light emitted from the micro LED chips at a front side and light emitted from the micro LED chip at a backside As shown in FIG. 1, to further prevent optical interference between light emitted from the micro LED chips at the front side and light emitted from the micro LED chip at the backside, the double-surface display panel 100 of the embodiment of the present disclosure further includes a first black matrix 70 and a second black matrix. 20. The first black matrix 70 is disposed on a light-emitting side of the first micro LED units 40. An orthographic projection of the first black matrix 70 on the substrate 10 covers an orthographic projection of the second micro LED units 50 on the substrate 10. The first black matrix 70 is configured to shield the second micro LED units 50 to prevent light leakage of the second Micro LED units 50 from affecting the first micro LED units 40. The second black matrix 20 is disposed on a light-emitting side of the second micro LED units 50. An orthographic projection of the second black matrix 20 on the substrate 10 covers an orthographic projection the first micro LED units 40 on the substrate 10. The second black matrix 20 is configured to shield the first micro LED units 40 to prevent light leakage of the first micro LED units 40 from affecting the second micro LED units 50.

It should be understood that the orthographic projection of the first black matrix 70 on the substrate 10 and the orthographic projection of the first micro LED units 40 on the substrate 10 do not overlap each other. Therefore, light emitted from the first micro LED units is prevented from being blocked. The orthographic projection of the second black matrix 20 on the substrate 10 and the orthographic projection of the second micro LED units 50 on the substrate do not overlap each other. Therefore, light emitted from the second micro LED units 50 is prevented from being blocked.

As shown in FIG. 2, in other embodiments of the present invention, the first micro LED units 40 and the second micro LED units 50 may be disposed on different sides. Specifically, the first micro LED units 40 are disposed on the first side 11 of the substrate 10, and the second micro LED units 50 are disposed on the second side 12 of the substrate 10. Compared with the embodiment as shown in FIG. 1, in the present embodiment, under a same display area, the first micro LED units 40 and the second micro LED units 50 respectively disposed on two opposite sides of the substrate 10 can have an increased pixel density, thereby improving pixel resolution.

To easily bind the pixel driving circuit layer to the first micro LED unit 40 and the second micro LED unit 50, the pixel driving circuit layer may be designed to have two layers, which are disposed on the first side 11 of the substrate 10 and the second side 12 of the substrate 10, respectively. Specifically, the pixel driving circuit layer includes a first pixel driving circuit 31 and a second pixel driving circuit 32. The first pixel driving circuit 31 is disposed between the first micro LED unit 40 and the substrate 10, thereby easily realizing a bonding connection between the first pixel driving circuit 31 and the first micro LED units 40. The second pixel driving circuit 32 is disposed between the second micro LED units 50 and the substrate 10, thereby easily realizing a bonding connection between the second pixel driving circuit 32 and the second micro LED units 50.

As shown in FIG. 2, the double-surface display panel 100 further includes a light-shielding layer disposed between the first micro LED units 40 and the second micro LED units 50 to prevent the first micro LED units 40 and the second micro LED units 50 from affecting each other because of light leakage.

An orthographic projection of the light-shielding layer on the substrate 10 covers the orthographic projection of the first micro LED unit 40 on the substrate 10 and the orthographic projection of the second micro LED unit 50 on the substrate 10.

Specifically, the light-shielding layer may have multiple layers, such as a first light-shielding layer 21 and the second light-shielding layer 22. The first light-shielding layer 21 is disposed on the first side 11 of the substrate 10, and the second light-shielding layer 22 is disposed on the second side 12 of the substrate 10. Furthermore, the first light-shielding layer 21 may be disposed on a surface of the first side 11 of the substrate 10. The orthographic projection of the first light-shielding layer 21 on the substrate 10 at least covers the orthographic projection of the first micro LED units 40 on the substrate 10, thereby shielding light emitted from the first micro LED units 40 leaking downward. The second light-shielding layer 22 may be disposed on a surface of the second side 12 of the substrate 10. The orthographic projection of the second light-shielding layer 22 on the substrate 10 at least covers the orthographic projection of the second micro LED units 50, thereby shielding light emitted from the second micro LED units 50 leaking upward.

The double-surface display panel may further include a first encapsulation layer 81 disposed on the first side 11 and covering the first micro LED units 40, and the second encapsulation layer 82 disposed on the second side 12 and covering the second micro LED unit 50. During a mass transfer process, the micro LED chips are respectively bonded to the first side 11 and the second side 12 of the substrate 10 having the above light-shielding layer and the above pixel driving circuit layer in two times, thereby forming the first micro LED units 40 and the second micro LED units 50, respectively. Then, the first encapsulation layer 81 is formed on the first micro LED units 40, and the second encapsulation layer 82 is formed on the second micro LED units 50.

Figure 3:
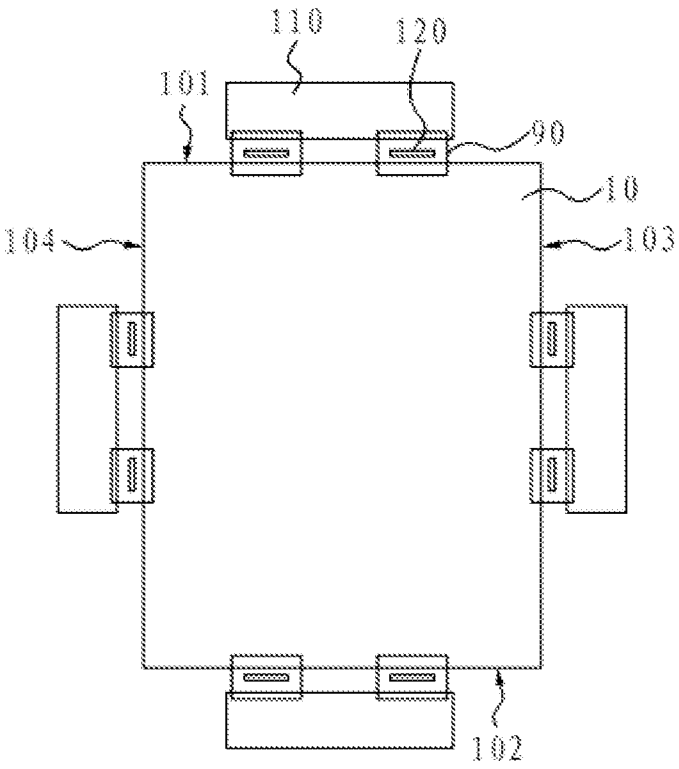
FIG. 3 is a structural schematic view showing the double-surface display panel bonded to a COF substrate provided by the embodiment of the present disclosure.
Figure 4:
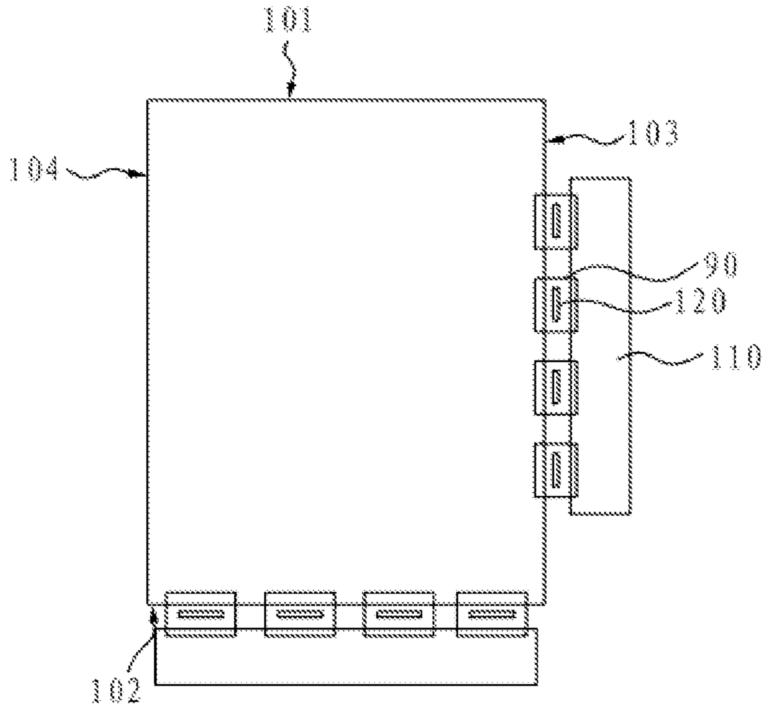
FIG. 4 is a structural schematic view showing the double-surface display panel bonded to a COF substrate provided by another embodiment of the present disclosure.
Figure 5:
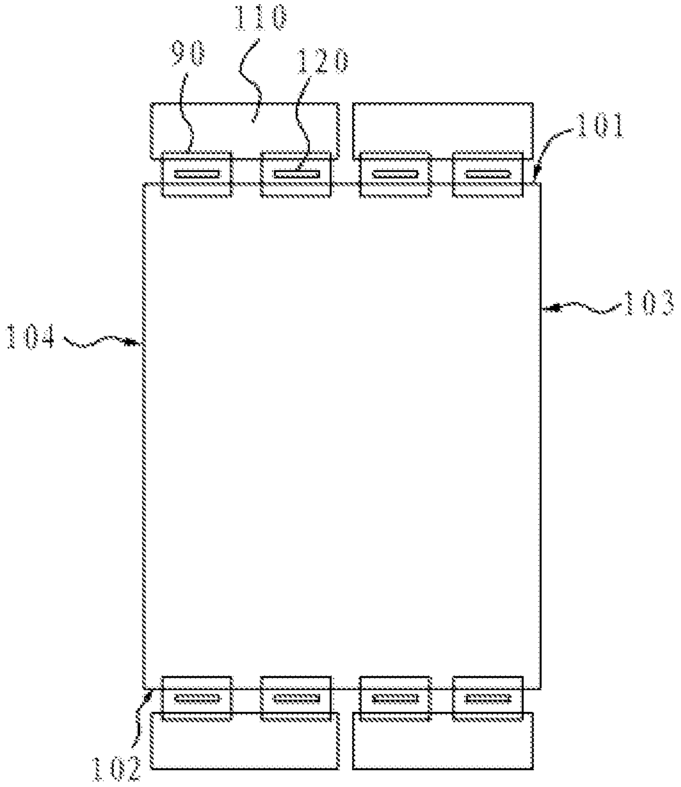
FIG. 5 is a structural schematic view showing a double-surface display panel bonded to a COF substrate provided by yet another embodiment of the present disclosure.

As shown in FIG. 3 to FIG. 5, at least one end portion of the double-surface display panel 100 is electrically connected to at least one chip on flex (COF) substrate 90, and a driver chip 120 is bonding connected to the COF substrate.

Specifically, the driver chip 120 extends along a direction parallel to the double-surface display panel 100, and does not need to be bent. Therefore, images displayed from the front side and the backside can be prevented from being blocked. An end of the COF substrate 90 is bonding connected to the double-surface display panel 100, and another end is bonding connected to a control circuit board 110.

Therefore, the driver chip 120 can be electrically connected to the pixel driving circuit layer and the control circuit board 110. The driver chip 120 may be a source driver chip or a gate driver chip. Correspondingly, the COF substrate 90 electrically connected to the source driver chip is a source COF substrate, and the COF substrate 90 electrically connected to the gate driver chip is a gate COF substrate.

The double-surface display panel 100 further includes a gate driver (not shown) and a source driver (not shown). The source driver is configured to provide a data signal to each sub-pixel in a pixel array. The source driver is electrically connected to the source COF substrate. The gate driver is configured to provide a gate scan signal to each sub-pixel in the pixel array. The gate driver is electrically connected to the gate COF substrate. The gate driver and the source driver are both disposed at an end of the double-surface display panel 100.

Specifically, as shown in FIG. 3, the double-surface display panel 100 includes a first end portion 101 and a second end portion 102 opposed to each other, and a third end portion 103 and a fourth end portion 104 opposed to each other. The third end portion 103 and the fourth end portion 104 are located between the first end portion 101 and the second end 102 portion.

In the embodiment shown in FIG. 3, the gate driver includes a first gate driver configured to control the first micro LED units 40 to display and a second gate driver configured to control the second micro LED units 50 to display. The source driver includes a first source driver configured to control the first micro LED units 40 to display and a second source driver configured to control the second micro LED units 50 to display. The first source driver, the second source driver, the first gate driver, and the second source driver are located at the first end portion 101, the second end portion 102, and the third end potion 103 and the fourth end portion 104, respectively. Each end portion is provided with a bonding pin configured to bonding connect a corresponding bonding pin on the COF substrate. That is, the COF substrate 90 is bonded to the first end portion 101, the second end portion 102, the third end portion 103, and the fourth end portion 104 of the display panel.

In other embodiments, as shown in FIG. 4, only two adjacent end portions of the display panel are bonded to the COF substrate 90. Specifically, the first source driver and the second source driver may be disposed at a same end portion of the double-surface display panel 100, and the first gate driver and the second gate driver may be disposed at another same end portion of the double-surface display panel 100. For example, the first source driver and the second source driver may both be disposed at the first end portion 101, and all COF substrates 90 bonding connected to the first end portion 101 may share the same control circuit board 110. The first gate driver and the second gate driver may both be disposed at the third end 103, and all COF substrates 90 bonding connected to the third end portion 103 may share the same control circuit board 110.

In other embodiments, as shown in FIG. 5, only two opposite end portions of the double-surface display panel are bonded to the COF substrate Specifically, the first source driver and the second source driver may be disposed at a same end portion of the double-surface display panel 100, and the first gate driver and the second gate driver may be disposed at another same portion end of the double-surface display panel 100. For example, the first source driver and the second source driver may both be disposed at the first end 101, and the first gate driver and the second gate driver may both be disposed at the second end portion 102.

Figure 6:
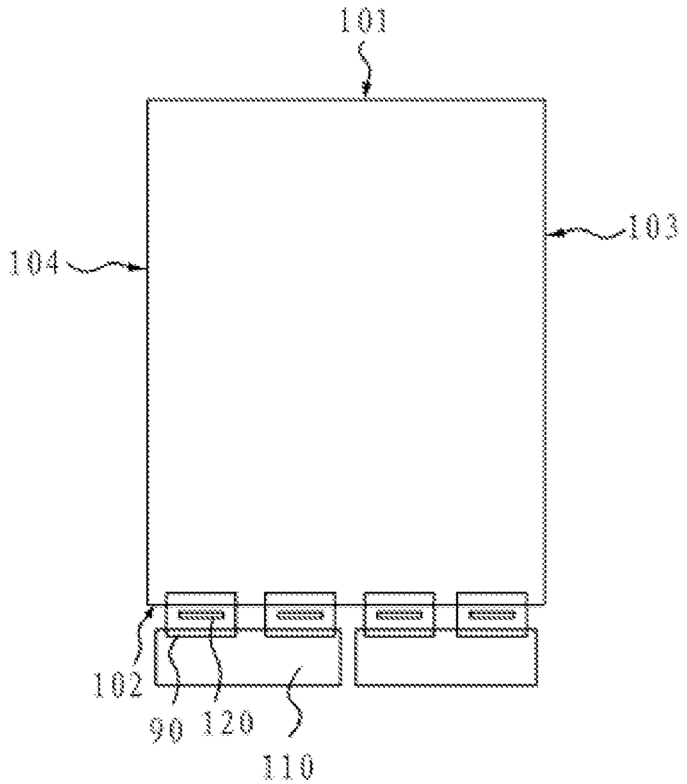
FIG. 6 is a structural schematic view showing a double-surface display panel bonded to a COF substrate provided by still another embodiment of the present disclosure.

Furthermore, as shown in FIG. 6, only one end portion of the double-surface display panel is bonded to the COF substrate 90. In the present embodiment, the first source driver and the second source driver may share the same driver chip 120. Therefore, not only can some driver chips 120 and some COF substrates 90 can be saved, but also bonding space and bonding processes can be saved.

When the first micro LED units 40 and the second micro LED units 50 are respectively disposed on two opposite sides of the substrate 10, correspondingly, the first source driver and the second source driver are respectively disposed on two opposite sides of the substrate 10, and the first gate driver and the second gate driver are respectively disposed on two opposite sides of the substrate 10. Correspondingly, the COF substrate 90 needs to be bonding connected to a front surface and a back surface of the double-surface display panel. Therefore, a bonding pin on one surface of the COF substrate 90 needs to be connected to the other surface by a metal wire at a lateral surface.

Figure 7:
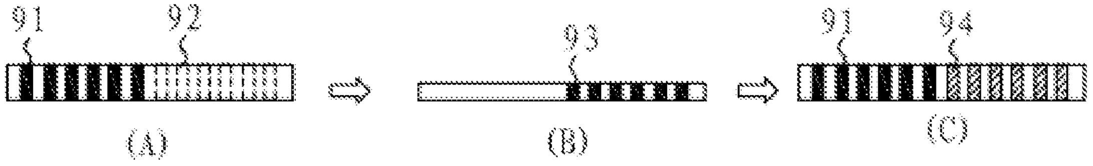
FIG. 7 is a structural schematic view showing a bonding pin of the COF substrate provided by the embodiment of the present disclosure.

Specifically, as shown in FIG. 7, FIG. 7(A) is a schematic front view, FIG. 7(B) is a schematic side view, and FIG. 7(C) is another schematic front view. The COF substrate 90 includes a first bonding pin 91 disposed on a surface of a first side of the COF substrate, and a second bonding pin 92 disposed on a surface of a second side of the COF substrate 90 opposite to the surface of the first side. When the COF substrate 90 is a gate COF substrate, the first bonding pin 91 is bonding connected to the first gate driver, and the second bonding pin 92 is bonding connected to the second gate driver. When the COF substrate 90 is a source COF substrate, the first bonding pin 91 is bonding connected to the first source driver, and the second bonding pin 92 is bonding connected to the second source driver.

Please refer to FIG. 7(B) and FIG. 7(C), the COF substrate 90 further includes a transfer line 93 disposed on the lateral surface of the COF substrate and a third bonding pin 94 disposed on the surface of the first side. The third bonding pin 94 corresponds to the second bonding pin 92 disposed on the surface of the second side, and the transfer line 93 is electrically connected to the second bonding pin 92 and the third bonding pin 94. The transfer line 93 is configured to connect the second bonding pin 92 on surface of the second side with the surface of the first side, thereby connecting the first bonding pin 91 on the surface of the first side and the second bonding pin 92 on the surface of the second side with the same driver chip 120. The same driver chip 120 controls a front surface and a back surface to display.

Figure 8:
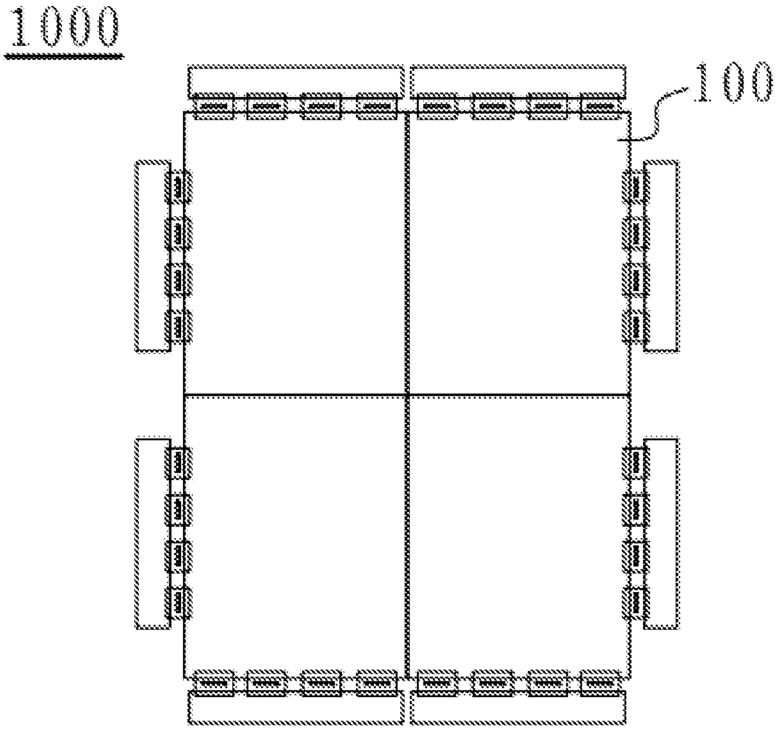
FIG. 8 is a structural schematic view showing a double-surface spliced display screen provided by an embodiment of the present disclosure.
Figure 9:
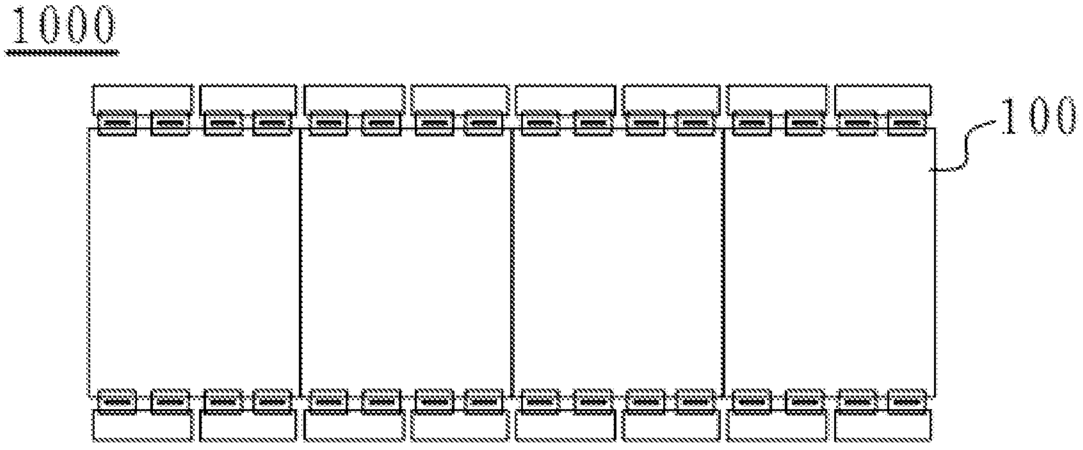
FIG. 9 is structural schematic view showing a double-surface spliced screen provided by another embodiment of the present disclosure.
Figure 10:
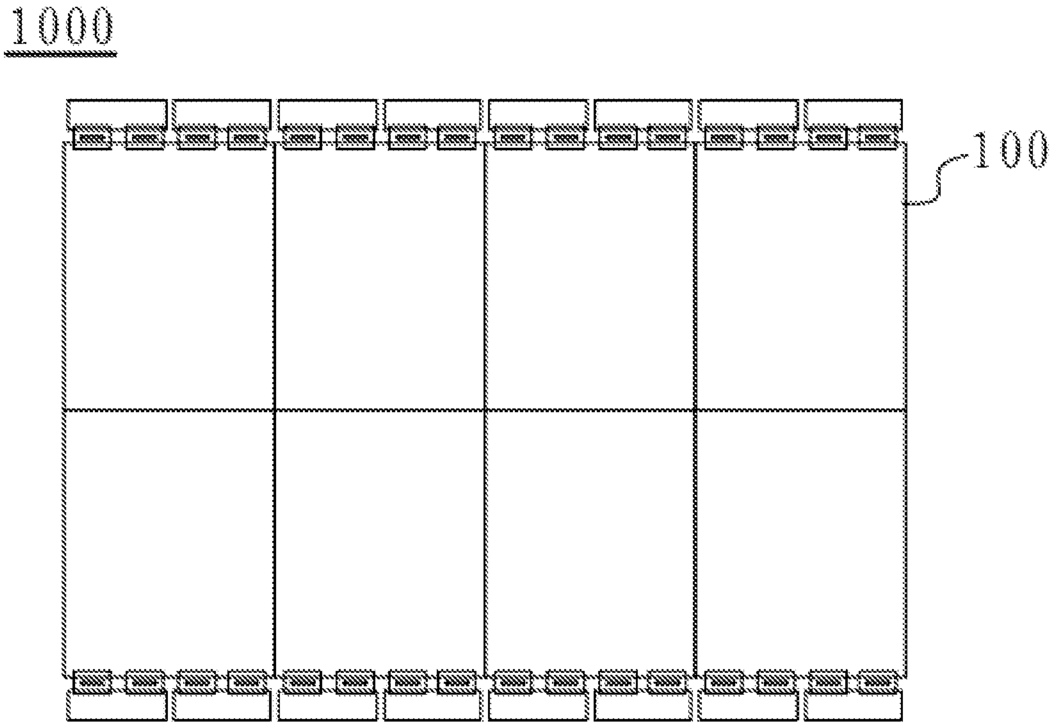
FIG. 10 is a structural schematic view showing a double-surface spliced screen provided by an embodiment of the present disclosure.

Please refer to FIG. 8 to FIG. 10, the present disclosure further provides a double-surface spliced display screen 1000. The double-surface spliced display screen 1000 includes multiple above-mentioned double-surface display panels 100 spliced to each other. A number of the double-surface display panel 100 is determined according to a bonding method and a splicing method applied to the double-surface display panel 100.

As shown in FIG. 8, the number of double-surface display panel 100 in the double-surface spliced display screen 1000 can be four. Two adjacent lateral edges (end portions) of the double-surface display panel 100 are bonded to a COF substrate. Moreover, as shown in FIG. 9, the double-surface spliced display screen 1000 can be formed by splicing multiple double-surface display panels 100 having the COF substrate 90 bonded to two opposite lateral edges (end portions). Furthermore, as shown in FIG. 10, the double-surface spliced display screen 1000 can be formed by splicing multiple double-surface display panels 100 having the COF substrate 90 bonded to only one end portion. In other embodiments, the double-surface spliced display screen 1000 can be formed by splicing multiple double-surface display panels 100 with different numbers of bonding end portions, thereby forming the double-surface spliced screen 1000 with various forms.

In the double-surface display panel 100 and the double-surface spliced display screen 1000 provided by the embodiments of the present invention, the first micro LED units 40 and the second micro LED units 50, which have opposite light-emitting directions, share the same substrate 10. Therefore, a thickness of an entire film of the double-surface display panel 100 can be reduced and can be less than 1 mm, thereby realizing extremely thin displays.

In the above embodiments, the focus of each embodiment is different, and for a part that is not detailed in an embodiment, reference may be made to related descriptions of other embodiments.

The double-surface display panel and the double-surface spliced display screen provided by the above embodiments of the present disclosure have been described in detail, which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A double-surface display panel, comprising:

a substrate, wherein the substrate comprises a first side and a second side opposite to each other;

a plurality of first micro light-emitting diode (micro LED) units distributed in an array manner, wherein the first micro LED units are disposed on the first side or the second side;

a plurality of second micro light-emitting diode (micro LED) units distributed in an array manner, wherein the second micro LED units are disposed on the first side or the second side, and a light-emitting direction of the second micro LED units is opposite to a light-emitting direction of the first micro LED units;

a first black matrix, wherein the first black matrix is disposed on a light-emitting side of the first micro LED units, and an orthographic projection of the first black matrix on the substrate covers both an orthographic projection of the second micro LED units on the substrate and an orthographic projection of gaps between the second micro LED units and adjacent ones of the first micro LED units on the substrate; and a second black matrix, wherein the second black matrix is disposed on a light-emitting side of the second micro LED units, and an orthographic projection of the second black matrix on the substrate covers both an orthographic projection of the first micro LED units on the substrate and an orthographic projection of gaps between the first micro LED units and adjacent ones of the second micro LED units on the substrate, so that overlapping regions are formed between the orthographic projection of the first black matrix and the orthographic projection of the second black matrix;

wherein the double-surface display panel comprises a pixel driving circuit layer, wherein the pixel driving circuit layer is disposed between the first micro LED units and the substrate, or the pixel driving circuit layer is disposed between the second micro LED units and the substrate;

the first micro LED units and the second micro LED units are disposed on a same side of the substrate, the first micro LED units and the second micro LED units are disposed on a same layer of the pixel driving circuit layer, and the orthographic projection of the first micro LED units on the substrate and the orthographic projection of the second micro LED units on the substrate do not overlap each other.

2. The double-surface display panel of claim 1, wherein the first micro LED units are disposed on the first side, and the second micro LED units are disposed on the second side, the pixel driving circuit layer comprises a first pixel driving circuit disposed between the first micro LED units and the substrate, and a second pixel driving circuit disposed between the second micro LED units and the substrate.

3. The double-surface display panel of claim 2, wherein the double-surface display panel comprises a light-shielding layer, and the light-shielding layer is disposed between the first micro LED units and the second micro LED units.

4. The double-surface display panel of claim 3, wherein an orthographic projection of the light-shielding layer on the substrate covers the orthographic projection of the first micro LED units on the substrate and the orthographic projection of the second micro LED units on the substrate.

5. The double-surface display panel of claim 1, wherein at least one end portion of the double-surface display panel is connected to at least one chip on flex (COF) substrate, and a driver chip is bonding connected to the COF substrate.

6. The double-surface display panel of claim 5, wherein the COF substrate extends along a direction parallel to the double-surface display panel, an end of the COF substrate is bonding connected to the double-surface display panel, and another end of the COF substrate is bonding connected to a control circuit board.

7. The double-surface display panel of claim 6, wherein the driver chip is a source driver chip or a gate driver chip.

8. A double-surface spliced display screen, comprising a plurality of double-surface display panels spliced to each other, wherein each of the double-surface display panels comprises:

a substrate, wherein the substrate comprises a first side and a second side opposite to each other;

a plurality of first micro light-emitting diode (micro LED) units distributed in an array manner, wherein the first micro LED units are disposed on the first side or the second side;

a plurality of second micro light-emitting diode (micro LED) units distributed in an array manner, wherein the second micro LED units are disposed on the first side or the second side, and a light-emitting direction of the second micro LED units is opposite to a light-emitting direction of the first micro LED units;

a first black matrix, wherein the first black matrix is disposed on a light-emitting side of the first micro LED units, and an orthographic projection of the first black matrix on the substrate covers both an orthographic projection of the second micro LED units on the substrate and an orthographic projection of gaps between the second micro LED units and adjacent ones of the first micro LED units on the substrate; and a second black matrix, wherein the second black matrix is disposed on a light-emitting side of the second micro LED units, and an orthographic projection of the second black matrix on the substrate covers both an orthographic projection of the first micro LED units on the substrate and an orthographic projection of gaps between the first micro LED units and adjacent ones of the second micro LED units on the substrate, so that overlapping regions are formed between the orthographic projection of the first black matrix and the orthographic projection of the second black matrix;

wherein the double-surface display panel comprises a pixel driving circuit layer, wherein the pixel driving circuit layer is disposed between the first micro LED units and the substrate, or the pixel driving circuit layer is disposed between the second micro LED units and the substrate;

the first micro LED units and the second micro LED units are disposed on a same side of the substrate, the first micro LED units and the second micro LED units are disposed on a same layer of the pixel driving circuit layer, and the orthographic projection of the first micro LED units on the substrate and the orthographic projection of the second micro LED units on the substrate do not overlap each other.

9. The double-surface spliced display screen of claim 8, wherein the first micro LED units are disposed on the first side, and the second micro LED units are disposed on the second side, the pixel driving circuit layer comprises a first pixel driving circuit disposed between the first micro LED units and the substrate, and a second pixel driving circuit disposed between the second micro LED units and the substrate.

10. The double-surface spliced display screen of claim 9, wherein the double-surface display panel comprises a light-shielding layer, and the light-shielding layer is disposed between the first micro LED units and the second micro LED units.

11. The double-surface spliced display screen of claim 10, wherein an orthographic projection of the light-shielding layer on the substrate covers the orthographic projection of the first micro LED units on the substrate and the orthographic projection of the second micro LED units on the substrate.

12. The double-surface spliced display screen of claim 8, wherein at least one end portion of the double-surface display panel is connected to at least one chip on flex (COF) substrate, and a driver chip is bonding connected to the COF substrate.

13. The double-surface spliced display screen of claim 12, wherein the COF substrate extends along a direction parallel to the double-surface display panel, an end of the COF substrate is bonding connected to the double-surface display panel, and another end of the COF substrate is bonding connected to a control circuit board.

14. The double-surface spliced display screen of claim 13, wherein the driver chip is a source driver chip or a gate driver chip.

* * * * *